United States Patent [19]

Del Monte

[11] 4,113,578

[45] Sep. 12, 1978

[54] MICROCIRCUIT DEVICE METALLIZATION

[75] Inventor: Louis A. Del Monte, Minnetonka, Minn.

[73] Assignee: Honeywell Inc., Minneapolis, Minn.

[21] Appl. No.: 809,960

[22] Filed: Jun. 27, 1977

Related U.S. Application Data

[63] Continuation of Ser. No. 365,778, May 31, 1973, abandoned.

[51] Int. Cl.² .......................... C25D 5/02; C25D 7/12; C25D 5/54; C23C 15/00
[52] U.S. Cl. ................................ 204/15; 204/192 R; 357/71; 427/92
[58] Field of Search ................. 204/192 R, 192 C, 15; 427/88, 92, 89; 357/71

[56] References Cited

U.S. PATENT DOCUMENTS

| | | |
|---|---|---|
| 3,408,271 | 10/1968 | Reissmueller et al. ............... 204/15 |
| 3,479,269 | 11/1969 | Byrnes, Jr. et al. ................. 204/192 |
| 3,737,380 | 6/1973 | Bachmeier ........................... 204/15 |
| 3,761,309 | 9/1973 | Schmitter et al. ................... 204/192 |

*Primary Examiner*—T. M. Tufariello
*Attorney, Agent, or Firm*—Theodore F. Neils

[57] ABSTRACT

Contact electrodes and electronic device interconnection pathways are formed by sputtering and by deposition methods supplemented by plating. These may be formed, for example, on integrated circuit wafers or mounting substrates.

18 Claims, 8 Drawing Figures

MICROCIRCUIT DEVICE METALLIZATION

This is a continuation of application Ser. No. 365,778, filed May 31, 1973, now abandoned.

BACKGROUND OF THE INVENTION

This invention relates to the formation of contact electrode bumps in structures such as integrated circuit wafers and mounting substrates.

High volume, fast handling and economical packaging systems are being developed for packaging microelectronic components to meet a growing demand for such components and systems of such components at a reasonable cost. One of the component mounting techniques, as a part of one of these packaging methods, is the so called "face-down" bonding technique. In this technique, contact electrodes in the form of small metallic bumps are provided on selected portions of a metallization interconnection network, usually, where electrical connections to external components are desired. This metallization interconnection network is provided in the component to be mounted, typically an integrated circuit chip. The component is to both be mounted by and to make electrical connection through these bumps.

Integrated circuit chips having these bumps thereon are placed with the network side facing a surface of a mounting substrate and placed such that the bumps are in contact with conductive lead portions provided on the substrate to which the bumps are to be attached. Next, heating the bumps causes them to flow and thus come into intimate contact with these conductive lead portions of the substrate so that upon cooling the desired bond results. It is therefore required that (1) the metal used for construction of the bumps and (2) the materials and structure with which this bump metal is to interface in a bond together result in bumps having sufficient cohesiveness in the molten state to provide support to the chip — i.e. so that the bumps do not collapse when molten. Such collapse would bring the chip into close proximity with or directly onto the substrate with the bump metal spread about so far as it would flow. A standoff bump not used in an intimate bond with the substrate conductive leads and perhaps not formed on the interconnection network can be used to keep the chip separated from the substrate, though it cannot prevent molten bump metal from flowing. Flowing of the bump metal can be prevented whether a standoff bump is used or not, by use of a glass dam on the substrate, as an example, surrounding the point of which a bond is intended to be made.

Another packaging method also has metallic bumps usually formed on a metallization interconnection network provided with a component to be packaged, again typically an integrated circuit chip, the bumps to be provided at selected portions of the network where contact with external components are desired. Contact with external components is again provided through connection with conductive lead portions provided on a mounting substrate. The chip mounting technique in this packaging method, however, differs from the "face-down" technique in that the chip face opposite the face having the interconnection network provided thereon is to also be mounted on a surface of the mounting substrate. This requires a lead frame having conductive leads therein with these conductive leads bonded to the bumps to provide leads for connection to the conductive lead portions provided on the substrate. This bonding technique may be termed the lead frame mounting technique.

The bumps in this bonding technique are not intended to flow appreciably when heat is applied to them for the purpose of their being bonded to the lead frame conductive leads. Rather, an eutectic bond is to formed between the bumps and the conductive leads requiring (1) that the bump metal and (2) the lead frame conductive lead metal be able to form a satisfactory eutectic bond. Since no appreciable flow is to occur there need be no provision to prevent a flow of the bump metal down the lead frame conductive lead.

In the first mounting technique noted above, it was indicated that some provision must be taken with respect to the substrate and the bump metal to prevent the bumps, which are intended to flow, from flowing any great distance across the substrate. This need to restrict the flow of molten bumps exists, as set out above, because unrestricted flow would cause the bumps to diminish and leave little to provide a standoff distance between the integrated circuit chip and the substrate. Even if a standoff bump is provided, unrestricted flow of the bump metal would result in no intimate electrical contact or an improper contact between chip and substrate.

As the above indicates, the choice of a packaging method and so of the component mounting technique (1) limits the kinds of metals which are satisfactory for making the contact electrode bumps on, for instance, a component metallization interconnection network and (2) limits the kinds of materials and/or structure which can be used in or near the network and the item to be bonded to at the points the contact electrode bumps are to be formed or bonded, respectively. Again, for example, an interconnection network is taken as provided on an integrated circuit chip and the chip is to be mounted on and to make electrical contact to a mounting substrate. In the "face-down" technique, the contact electrode metal must be capable of flowing and usually cannot be allowed to wet much of the surface in either its immediate area on the integrated circuit chip or in the immediate area of the intended bond on the conductive lead portion of the substrate. When this is the case the surface tension of the molten metal comprising most of the bump serves to give the molten bump enough structural integrity to maintain a standoff distance between the chip and the substrate.

A well-known metallurgical system for a bump used in the "face-down" mounting technique is provided in four layers on a selected portion of the interconnection network. The selected portion is usually available as an exposure of the network through an opening in an insulating overlayer. The interconnection network is usually constructed of aluminum.

To provide the metallurgical system, a metal mask is placed on the insulating overlayer with the mask having an opening therein that is concentric with but larger than the opening in the insulating overlayer. By use of evaporation deposition techniques, a layer of chromium is deposited on the aluminum through the opening in the metal mask and the opening in the insulating overlayer. This is followed by evaporating copper onto the chromium which in turn is followed by evaporating gold onto the copper. These three metal layers are for the purposes of sealing, preventing unwanted intermetallic compounds from forming and to provide properly adhering films to the various interfaces. The total thickness of these three layers is typically 10,000 Å or less. It is important that not too much gold be provided because it forms unwanted intermetallic compounds with the tin in the solder which is to be next evaporated onto the gold. Solder then is evaporated onto the gold and forms the main body of the bump usually being several mils in height.

The use of the lead frame mounting technique, however, generally prevents the use of solder as a major component in the body of the bump. Typically, solder is not used to and does not form a eutectic bond with another metal being joined therewith in such a way as to include, as a constituent, that other metal in the metallurgical bond to be formed. Rather, solder is used in joining with another metal because of its adhesion properties to the surface of the other metal when the solder solidifies from the molten state in which state it wetted the surface of the other metal. If, however, a lead frame is brought into contact with a molten solder bump the result will be that the solder will flow along the lead frame lead in such quantity as to greatly diminish the bump. Further, applying pressure through the lead frame lead to the molten solder bump is unavoidable in bringing the lead frame into contact with the bump. This pressure on the molten solder bump will overcome the surface tension of the molten solder bump giving the bump the necessary cohesiveness to prevent it from flowing and so flow across the surface on which the bump is provided will occur worsening the molten state flow problem.

Thus, solder typically isn't a satisfactory metal for a major portion of a bump body where a eutectic bond is to be formed with a lead frame lead made of a metal commonly used for such leads. The use of a solder bump in a molten state for attaching a lead frame lead would be difficult without making undesirable alterations in the lead frame lead itself and/or in the surroundings of the point on the surface where the bump is provided.

Use of eutectic bonding for the lead frame mounting technique requires that the metal for use in the major portion of the bump body and the metal to be used for the conductive leads in the lead frame be capable of forming a eutectic bond at pressures and temperatures not too extreme considering the chip and the substrate must thereafter by functional. The eutectic temperature, which will be below the melting point of either metal involved, must be substantially higher than that at which the bond to the substrate conductive leads is formed at the opposite end of the lead frame lead. This latter bond to the substrate conductive lead is usually a solder bond. These criteria assure that the metal comprising the major portion of the bump electrode can form eutectic bond with the relatively small amount of metal in the lead frame lead without the bump appreciably losing its structural and shape characteristics as the eutectic temperature is reached and further assures that the bond will not be degraded by the formation of a bond to the substrate conductive leads at the opposite end of the lead frame lead. One additional desired feature for the metal which is to comprise the major portion of the bump body is that it be relatively inert so as to tend to not form undesirable compounds which may effect the integrity of the bonds or otherwise effect materials surrounding the bond.

A satisfactory combination of metals for the lead frame mounting technique are gold for the major portion of the bump body and tin which can be plated on a lead frame conductive lead of copper. This combination of metals being satisfactory, the same layer pattern of metals could be used to construct bumps in the lead frame mounting technique as are used in the "face-down" mounting technique up to the deposition of the solder, these being chromium on the aluminum interconnection network, then copper and finally gold with the gold present in much greater quantity than in the "face-down" technique to provide the desired bump height. Other metals can be used in place of the copper and the chromium. Further, combinations of metals other than gold and tin are also possible.

Since the same layer pattern of metals may be placed on the aluminum interconnection network, it would seem that the same deposition technique could be used to place them there, i.e. evaporation. However, the use of evaporation to deposit an expensive metal in quantity, such as the gold here, is uneconomical because such a small fraction of the metal evaporated reaches the position desired for deposition but is rather deposited in many places in the deposition chamber since the evaporated metal fills the chamber with little directivity.

Plating methods have also been used to construct contact electrode bumps on interconnection networks. However, in known plating methods a metal mask is not used. Rather, the mecessary layers of the metals, the same chromium, copper and gold pattern, are blanket evaporated over the entire surface of the insulating layer covering the interconnection network and over the exposed selected portions of the interconnection network. An undesirable result of this is that on cooling, particularly in the case of integrated circuits, the rapid contraction of the now condensed metals tends to cause microcracking at various locations of the insulating layer provided over the interconnection network which leads to yield loss is subsequent operations.

After the blanket evaporation, a photoresist layer is placed over the last evaporated metal and openings are provided in the photoresist across from the selected portions of the interconnection network where bumps are desired to be placed on the last evaporated metal. A gold plating process over the result is used but gold will adhere and plate only to the exposures of the last evaporated metal in the photoresist layer openings. The photoresist is then removed as are those large portions of the several layers of evaporated metals which are not serving as a base for a bump. Removing these evaporated metals requires an undesirable multiplicity of etching steps. If the microcracking noted above has occurred at points so as to expose portions of the interconnection network below, one or more of the etching steps may also etch the aluminum used in the interconnection network.

At this point a sintering heat treatment in dry nitrogen is required to cause the interconnection network material, usually aluminum, to diffuse through both its own oxides and through any insulating layer material residue formed on the selected portions to be sure a good contact is made with the overlaying evaporated metal layers if a relatively small electrode resistance is desired. This sintering is required because cleaning methods are limited without the use of a metal mask to protect surfaces because of the resulting degradation of surface characteristics of those surfaces not involved in supporting the bumps.

The lead frame component mounting technique, particularly for integrated circuits, is a quite desirable technique when the circuit operation of the components as mounted is considered because the component face not having the bumps thereon is mounted directly on the substrate. This provides, as a natural step of the technique, much better thermal dissipation for heat generated by the component during circuit operation than does the "face-down" mounting technique where much of the heat dissipation would be through the bumps alone unless further measures were undertaken. Thus it is desired to have an economical and effective process for providing the contact electrode bumps on the component for use in the lead frame component mounting technique.

SUMMARY OF THE INVENTION

The present invention utilizes sputtering and plating techniques to provide the contact electrode bumps. The process may involve only sputtering steps to accomplish the deposition of metals or may involve sputtering supplemented by plating steps to provide contact electrode bumps. Plating may also be used to supplement other types of initial deposition steps.

Portions of a structure, typically portions of a metallization interconnection network, are selected on which to provide contact electrode bumps. A mask, typically of metal, having a pattern of openings therein corresponding to the selected portions, is placed against the structure such that the openings are concentric with the areas selected upon which to provide the bumps.

This masked structure is to be provided in a chamber of a sputtering apparatus. The sputtering apparatus contains source electrodes each having a type of metal which is desired to be deposited through the openings in the mask. A gas atmosphere is provided in this chamber.

The selected portions on which the contact electrode bumps are to be formed, perhaps made partially available heretofore, are first completely exposed through use of a sputter-cleaning step. Following this, each type of metal desired to be deposited through the openings in the metal mask is sputtered through these openings in the order of deposition desired. The good directivity of the ejected metal atoms resulting from use of the sputtering method leads to use of smaller amounts of each type of metal than would be the case in using an evaporation technique. In addition, forming bumps by sputtering means that each sputtered layer has a better adhesion to the material below it to give better adhering bumps because of the self-cleaning feature of the sputtering method and because of the greater likelihood of forming chemical bonds in each sputtered layer. If only metal sputtering steps are to be used, the metals sputtered must reach a sufficient height to form a contact electrode bump which is about 0.2 of a mil or more.

If the sputtering steps are to be supplemented by a plating step, the mask is removed after the metals have been sputtered through its openings to form a metal base for a plated bump with the base being of a height less than that desired for a bump. A metal flash layer, typically the same metal as the last metal sputtered, is blanket evaporated over the structure surface when electroplating techniques are to be used. A photoresist layer is then provided on this metal flash layer with openings being provided in the photoresist layer which are concentric with the selected portions. A metal is then plated onto the metal exposed in the openings in the photoresist layer, typically again the metal last sputtered. The plating metal does not plate or adhere to the photoresist layer. The photoresist layer is then removed as is the metal flash layer leaving the contact electrode bumps.

Forming a base of sputtered metal layers by use of a mask means the sputter-cleaning step is available to be used initially in the plating process so no sintering step is required to achieve relatively low electrode resistance if that is desired. The sputtered metal layers also provide a strongly adhering metal base upon which to plate the remaining metal to form contact electrode bumps. Microcracking is minimized since the sputtered layers cover but a small fraction of the structure surface.

Electroless plating may be used in place of electroplating to chemically plate a portion of the metal used in providing the major portion of the bump. This plating technique eliminates use of a metal flash layer and use of a photoresist layer.

DESCRIPTION OF THE PREFERRED EMBODIMENTS

Figure 1:
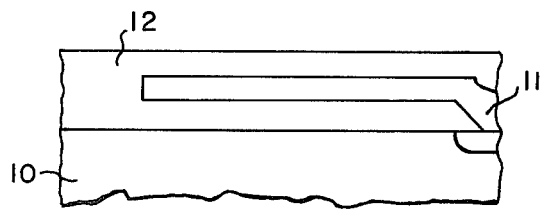
FIGS. 1 through 5 show the result of steps in the sputtering process leading to contact electrode bumps.

FIG. 1 shows a portion of a monolithic integrated circuit wafer after metallization and passivation and before processing has been begun to place contact electrode bumps on an interconnection network. Silicon material 10 is shown supporting aluminum electronic device interconnection network 11 which is shown making a connection to silicon layer 10. Interconnection network 11 for the most part is supported on silicon dioxide layer 12 and is also covered by silicon dioxide layer 12 which is provided for passivation and protection.

Figure 2:
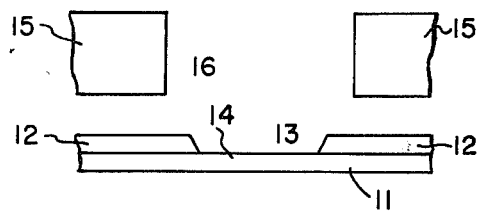

FIG. 2 shows an opening 13 made in silicon dioxide layer 12 for exposing a selected portion 14 of the interconnection network 11. Silicon portion 10 of FIG. 1 has been omitted from the remaining drawings since it does not have a direct role in the process described herein. Opening 13 can be provided by well known etching methods followed by the sputter-cleaning step set out below. Opening 13 may be made entirely by the methods of the sputter-cleaning step in some circumstances. There are situations in which it may be desirable to form bumps on portions of the structure which are not part of an interconnection network. Then the metal 11 would not be part of an interconnection network and indeed, with the proper choice of materials for forming the bump, a bump might be formed on silicon or on silicon dioxide or other material so no metal would need to be provided where aluminum metal 11 is shown.

Also shown in FIG. 2 is a portion of a metal mask 15 still separated from but about to be placed against the structure comprising the silicon dioxide layer 12, the interconnection network 11 and the now omitted silicon.

The opening 16 in the mask is to be placed in substantial concentricity with the selected portion of the interconnection network 14 and so with opening 13, leaving some of the silicon dioxide 12 exposed. Metal masks in the form of a sheet of metal with selected openings provided therein are well known and a material suitable for such a mask is molybdenum.

Figure 3:
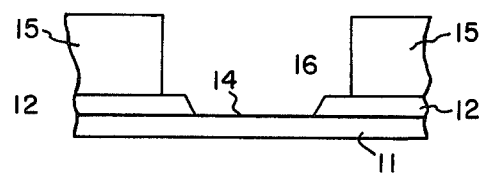

FIG. 3 shows metal mask 15 in place against silicon dioxide layer 12. At this point in the process, the sputter-cleaning step noted above to occur after etching, is performed. This step is performed to remove silicon dioxide residues, metal oxides and any other contaminents on selected portion 14 of interconnection network 11 to first completely expose this selected portion and to remove contaminents from the surfaces of silicon dioxide layer 12 remaining exposed in opening 16 in the mask 15. This cleaning will be performed inherently in those circumstances where opening 13 is provided by sputter-cleaning methods. Performance of an effective cleaning here removes the need for a sintering step later in the process if very low contact resistance is desired. The sputter-cleaning is performed in the vacuum chamber of a sputtering apparatus wherein the wafer as masked above is positioned. A standard sputtering apparatus of the type used in making thin film depositions generally is satisfactory.

The vacuum chamber is pumped down and an inert gas atmosphere is placed therein, usually argon, although other gases or gaseous mixtures can be used in this and other circumstances including, in some situations, gases which are not inert. A continual flow of argon through the vacuum chamber by bleeding off and adding helps to remove and so reduce contaminents formed therein during sputtering. This vacuum pump-down and provision of a selected gas atmosphere occurs only once during the sputtering steps in this process. The ordinary atmosphere is not admitted to the chamber after the initial pump-down preceding the use of sputter-cleaning kinds of steps until the metal sputtering steps have been completed. In general, the pressure of the selected atmosphere for the chamber need never approach ordinary atmospheric pressure after the initial pump-down, i.e. initial major pressure reduction, until sputtering is completed. This performance of the sputtering steps during a single provision of a selected atmosphere strongly aids the prevention of contamination of exposed surfaces occurring during the sputtering steps in the process. Generally, time consuming additional pump-downs are avoided during processing.

An inactive electrode is contained in the vacuum chamber as are source electrodes, each of the latter having a type of metal provided in it which is desired to be deposited through the opening 16 of metal mask 15. For sputter-cleaning, a sufficiently large potential is applied between the inactive electrode and the wafer structure, the wafer being negative with respect to the inactive electrode, to cause ionization of the argon gas between the inactive electrode and the wafer structure. The resulting argon ions then impinge on the wafer structure with sufficient momentum to remove surface particles thereon and atoms therein. This impingement of argon ions is continued until some hundreds of angstroms (on the order of 300 Å) of the silicon dioxide, silicon dioxide residue, metal oxides and/or aluminum have been removed following etching. The partial pressure of the argon gas for the cleaning operation is typically 20 microns of mercury.

After the cleaning operation, the first type of metal desired to be deposited through opening 16 in metal mask 15 and onto selected portion 14 is then sputtered both onto this area and onto those portions of silicon dioxide layer 12 exposed in openings 16. To sputter a selected metal, a sufficient potential is applied between the inactive electrode and the source electrode (source electrode negative during times metal is sputtered) having this metal therein to ionize the gas in the vacuum chamber between these two electrodes. Again, this gas is argon and the earth's atmosphere is not admitted to the chamber between the sputter-cleaning step and the sputtering of metals. The masked wafer is placed near or on the inactive electrode (in the cathode dark space) with the areas on which the deposit is to occur facing the source electrode.

Sputtering can be carried out using direct (DC) voltage or with radio frequency (RF) voltage and with the target upon which the sputtering deposition is to occur either having or not having a direct voltage bias with respect to the anode, the anode usually being at ground potential. DC voltage sputtering, while convenient from a power supply point of view, must be carried on at relatively high pressures of gas atmosphere, here argon, in the sputtering chamber. Such sputtering can be performed in a pressure range of 10 to 100 microns of mercury considering special circumstances, but typically it is carried on at from 40 to 50 microns of mercury. RF voltage sputtering, on the other hand, is usually carried on at less than 20 microns of mercury as an operating pressure. Since higher pressures of gas means more of the sputtered metal is diverted in passage to the target, higher gas pressure in the sputtering chamber leads to decreasing efficiencies in the amount of metal reaching the proper locations versus the amount of metal sputtered from the target.

Operating the target upon which a sputtering deposition is to occur at a bias with respect to the anode can improve adhesion because of the target scrubbing action the ions attracted to the target have upon it. Here again, however, this leads to a reduced efficiency in the use of the metal sputtered.

Thus, RF voltage sputtering is often preferred where expensive metals are to be sputtered onto a target because of its higher efficiency in the use of such metals. Further, RF voltage sputtering permits use of insulating targets, such as a substrate upon which contact electrodes are to be formed, as well as targets which are conductors, as here where the target is a masked wafer having conductive openings exposed.

In this arrangement, the atoms ejected from the source electrode, due to the impingement of argon ions, have a strong tendency (1) to be directed toward the inactive electrode and the masked wafer and (2) to strike them with a fairly substantial velocity, a much higher velocity than occurs on striking a wafer structure due to an evaporation deposition. This provides two substantial advantages for the sputtering of contact electrode bumps where a major portion of a bump consists of an expensive metal.

The first advantage is due to the relatively high directivity of the ejected source electrode atoms toward the wafer structure. This results in a much larger fraction of the metal supplied from a source being deposited on the wafer structure rather than on other surfaces in the deposition chamber when compared to evaporation. In turn this means that a much smaller amount of an expensive metal required to be deposited is wasted.

The second advantage comes about because of the relatively high velocity which the ejected atoms strike the wafer structure. The process tends to be self-cleaning as it proceeds due to the high velocity impact of atoms tending to clean away contaminents and to clean away poorly bonded atoms of the metal ejected from the source electrode which have been previously deposited. This in turn results in the contact electrode bumps having a substantially greater adhesion to the wafer structure and greater adhesion between its constituents through each layer of bump metal which has been deposited by sputtering.

Figure 4:
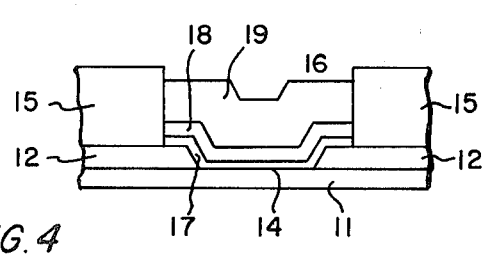

As shown in FIG. 4, chromium is the first metal deposited by sputtering to form layer 17 on selected portion 14 and on the exposed portions of silicon dioxide layer 12. Chromium exhibits a strong adhesion to both aluminum and to silicon dioxide which is the basis for choosing it for the first layer. Typically, a chromium layer of 1500 Å is provided.

The next layer of metal, copper, shown as layer 18, is typically deposited in a codeposition with the last 500 Å of the chromium layer to create a dual phase layer of chromium and copper. This dual phase layer is not separately shown in FIG. 4 and generally is not necessary though helpful in providing good adhesion between the layers. The codeposition is ended with the completion of the chromium layer 17 to the desired height and an all copper layer, 18, of up to 5000 Å is thereafter deposited by sputtering. This copper layer adheres well to the chromium and to the third layer of metal to be used, gold. Both the copper layer 18 and the chromium layer 17 act to limit metallic diffusion so that the materials underlying these respective layers are prevented from forming undesirable intermetallic compounds with the gold. Other metals may be used for either of these layers, particularly substituting either nickel or silver for copper.

The third layer to be deposited by sputtering is gold. When sputtering is to be the only method of metal deposition used to form the contact electrode bumps, which is the case shown in FIG. 4, gold is sputtered to the desired height of the contact electrode bump. The bump height is a minimum of about 0.2 mil if proper bonding is to be achieved since the pressure and heat of bonding will cause the bump to collapse a tenth of a mil or so. A more desirable bump height for bonding would be 0.5 mil.

Figure 5:
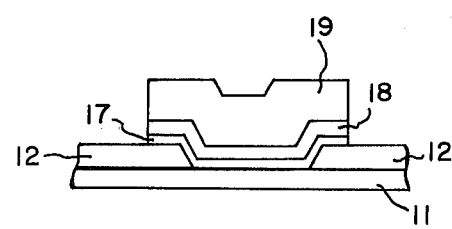

The masked wafer is then removed from the vacuum chamber of the sputtering apparatus and the mask in turn is removed from the wafer. Removal of the mask must occur in a direction perpendicular to the wafer surface to avoid shearing off any of the now formed contact electrode bumps. The wafer is then placed in an etching solution for a slight etch to remove any gold metal which may have "sprayed" under the mask during the sputtering of the gold. The wafer is then rinsed in deionized water. The result is shown in FIG. 5.

While sputtering is a more efficient way to deposit metal for contact electrode bumps in saving on the metal used than is evaporation, in the case of an expensive metal it may still be desirable to further reduce loss of the metal which occurs because of its not being deposited where only needed on a structure. Plating-on an expensive metal can improve the efficiency of its use and any "misdirected" or excess metal can be etched away and recovered from the etching solution used in the plating process. However, it is still possible to sputter layers of other metals on the selected areas of the interconnection network before the expensive metal is plated-on to provide a metal layer plating base so that both sputtercleaning and the better adhesion properties of metals deposited by the sputtering process can be retained. These small, scattered selected areas on which the metal bases are formed confine any microcracking to occurring approximately only in surfaces which will be covered by the bumps upon completion since the plated metal is to adhere only to these metal bases to complete the bumps.

Figure 6:
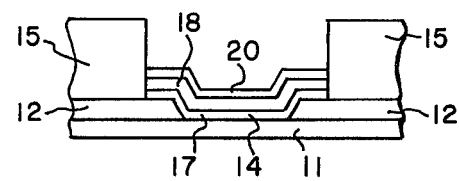
FIGS. 6 through 8 show the results of steps in the supplementary plating process leading to contact electrode bumps.
Figure 7:
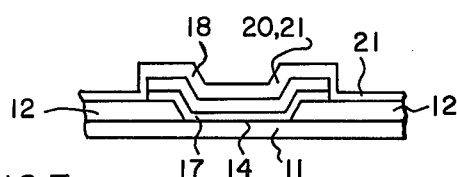

To supplement the above described sputtering process by the addition of plating steps, only a thin layer of gold 20 is sputtered on copper layer 18 as is shown in FIG. 6 rather than sputtering gold until the desired bump height is reached as was shown in FIG. 4. The metal mask 15 is then removed and, in a first plating method, a very thin gold flash layer is sputtered on the entire surface of the wafer. This very thin layer will not cause microcracking. The gold flash layer combines with the sputtered gold layer 20 and is shown as layer 20, 21 in FIG. 7. Electroplating is used in this first plating method and the need to join all of the metal layer plating bases into one electrode for plating purposes requires providing gold flash layer 21.

Figure 8:
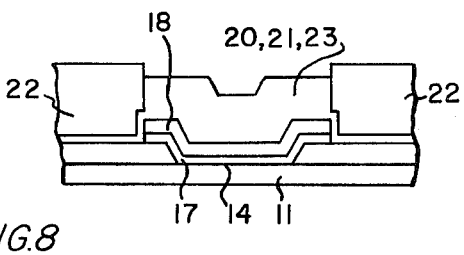

A photoresist layer 22 is then provided on the gold flash layer by standard methods and an opening is provided in the photoresist layer over the deposited layers of chromium 17 and copper 18 as well as the portion of gold layer 20, 21 positioned over copper layer 18 as shown in FIG. 8. Using standard electroplating techniques, gold is then plated onto the exposed gold layer 20, 21. The gold supplied in this plating process will adhere only to the gold layer 20, 21 and will not plate or adhere to the photoresist layer 22. Gold is plated to the desired height of a contact electrode bump to form gold layer 20, 21, 23.

The photoresist layer 22 is then removed by standard methods. The gold flash layer is next etched away except where covered by the plated-on gold forming the bump. A small portion of the plated-on gold is also etched away. Little microcracking is exposed for this etching to reach and, since also very little etching is required to remove the very thin flash layer, no significant etching of the interconnection network occurs. No sintering is required as is otherwise required if relatively low electrode resistance is desired because of the sputter-cleaning step performed prior to the sputtering on of chromium layer 17. The resulting bump is approximately the same as that shown in FIG. 5.

A second plating method, alternative to the above electroplating method, is available which is somewhat less efficient in the use of gold but which eliminates the providing of a metal flash layer and the providing of a photoresist layer. This alternative method uses standard electroless plating or chemical plating techniques. Such techniques are not, as so far developed, fully satisfactory in providing all of the gold (meaning gold beyond that needed in forming a metal base) for a full 0.5 mil gold contact electrode bump but can be satisfactorily used to provide the last 0.2 or 0.3 mil of the gold needed to form such a bump. Additional sputtering of gold is required to provide the first 0.2 mil or so of gold prior to the electroless plating step. The additional sputtering reduces to some extent the efficiency in use of gold achieved by the above electroplating method.

To use electroless plating, the same steps which are performed in providing an entirely sputtered bump are repeated except the process is terminated before the last 0.2 or 0.3 mil of gold used in constructing the bump has been sputtered into place. At this point, referring to FIG. 4, gold layer 19 would be thinner than shown in FIG. 4 by the 0.2 or 0.3 mil desired to be formed by electroless plating. The sputtering of gold is then terminated at this point and metal mask 15 is removed. The wafer is then immersed in a chemical plating bath and gold is thereby plated on the gold already sputtered on to provide the contact electrode bump approximately shown in FIG. 5. The gold will not chemically plate onto the silicon dioxide layer 12 which has an unactivated surface. Thus, though the sputtering of gold provides a larger fraction of the gold in the contact electrode bump than it does in the electroplating method, the steps of providing a metal flash layer and of providing a photoresist layer have been eliminated.

Using the same supplementary plating steps of either of the above plating methods but having the metal base structure, comprising layers of chromium 17, copper 18 and gold 20 shown in FIG. 6 or some other metal base structure, placed there by use of well known evaporation deposition methods will provide a process having nearly the same efficient use of gold. A plated gold bump will be provided on a satisfactory metal base. If sputter-cleaning is used prior to evaporation, sintering after the completion of the plating steps can usually be avoided also in providing a relatively low electrode resistance if desired. Other methods may be used in some circumstances for providing the metal bases on a structure upon which to plate bumps such as "printing" through screens. Deposited structures other than contact electrode bumps may be provided by supplementary plating methods such as electronic device interconnection pathways.

Bumps may be provided on many kinds of structures other than integrated circuit wafers by the methods described herein with substrates upon which various kinds of electronic components are to be mounted, including integrated circuit chips, being a typical example.

The embodiments of the invention in which an exclusive property or right is claimed are defined as follows:

1. A method for forming deposited metallic formations on selected portions of an electronic device interconnection network, provided on a structure having a layer of insulating material covering said selected portions, through using a sputtering chamber provided with one or more source electrodes each with a metal which is selected to be sputtered, said method comprising:
   providing openings in said insulating layer to expose said selected portions;
   providing said structure, masked with a separate mask having sputtering openings therein, in a sputtering chamber with said mask positioned against said structure in a manner such that said sputtering openings are positioned substantially concentric with the corresponding said selected portions;
   providing a low pressure gas atmosphere in said chamber;
   sputtering each said metal through said sputtering openings in a selected order for a time sufficient to obtain, through said sputtering openings, a selected amount of each of said metals;
   removing said mask to leave a structure resultant surface;
   providing a metal flash layer on said structure resultant surface;
   providing a photoresist layer on said metal flash layer, said photoresist layer having plating openings therein which are substantially concentric with said selected portions; and
   electroplating a plated metal layer through said plating openings onto said metal flash layer where provided on said metals as sputtered.

2. The method of claim 1 wherein said providing of said low pressure gas atmosphere is followed by sputter-cleaning to expose said selected portions through said sputtering openings.

3. The method of claim 1 wherein said electronic device interconnection network is of aluminum.

4. The method of claim 3 wherein said metals are as follows listed in said selected order: chromium, copper and gold.

5. The method of claim 3 wherein said metals are as follows listed in said selected order: chromium, nickel and gold.

6. The method of claim 3 wherein said metals are as follows listed in said selected order: chromium, silver and gold.

7. The method of claim 4 wherein said deposited metallic formations form a contact electrode having a height of 0.2 mil or more.

8. The method of claim 5 wherein said deposited metallic formations form a contact electrode having a height of 0.2 mil or more.

9. The method of claim 6 wherein said deposited metallic formations form a contact electrode having a height of 0.2 mil or more.

10. A method for forming deposited metallic formations on selected portions of an electronic device interconnection network, provided on a structure having a layer of insulating material covering said selected portions, through using a sputtering chamber provided with one or more source electrodes each with a metal which is selected to be sputtered, said method comprising:
    providing openings in said insulating layer to expose said selected portions;
    providing said structure, masked with a separate mask having sputtering openings therein, in a sputtering chamber with said mask positioned against said structure in a manner such that said sputtering openings are positioned substantially concentric with corresponding said selected portions;
    providing a low pressure gas atmosphere in said chamber;
    sputtering each said metal through said sputtering openings in a selected order for a time sufficient to obtain, through said sputtering openings, a selected amount of each said metals;
    removing said mask to leave a structure resultant surface; and
    electrolessly plating a plated metal layer on said metals as sputtered, whereby said deposited metallic formations result having sputtered metal bases adhering to said selected portions.

11. The method of claim 10 wherein said providing of said low pressure gas atmosphere is followed by sputter-cleaning to expose said selected portions through said sputtering openings.

12. The method of claim 10 wherein said electronic device interconnection network is of aluminum.

13. The method of claim 12 wherein said metals are as follows listed in said selected order: chromium, copper and gold.

14. The method of claim 12 wherein said metals are as follows listed in said selected order: chromium, nickel and gold.

15. The method of claim 12 wherein said metals are as follows listed in said selected order: chromium, silver and gold.

16. The method of claim 13 wherein said deposited metallic formations form a contact electrode having a height of 0.2 mil or more.

17. The method of claim 14 wherein said deposited metallic formations form a contact electrode having a height of 0.2 mil or more.

18. The method of claim 15 wherein said deposited metallic formations form a contact electrode having a height of 0.2 mil or more.

* * * * *